(12) United States Patent
Malone et al.

(10) Patent No.: US 6,997,247 B2
(45) Date of Patent: Feb. 14, 2006

(54) MULTIPLE-PASS HEAT EXCHANGER WITH GAPS BETWEEN FINS OF ADJACENT TUBE SEGMENTS

(75) Inventors: Christopher G. Malone, Loomis, CA (US); Glenn C. Simon, Auburn, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/835,955

(22) Filed: Apr. 29, 2004

(65) Prior Publication Data

US 2005/0241812 A1    Nov. 3, 2005

(51) Int. Cl.
*F28D 1/047*    (2006.01)

(52) U.S. Cl. ............... 165/150; 165/80.4; 165/152

(58) Field of Classification Search ............... 165/80.4, 165/80.5, 150–153, 178
See application file for complete search history.

(56) References Cited

U.S. PATENT DOCUMENTS

| | | | |
|---|---|---|---|
| 1,524,520 A * | 1/1925 | Junkers | 165/146 |
| 3,189,087 A | 6/1965 | Parris | |
| 3,877,517 A | 4/1975 | Pasternak | |
| 4,002,198 A | 1/1977 | Wagner et al. | |
| 4,256,177 A | 3/1981 | Saperstein | |
| 4,778,004 A * | 10/1988 | Paulman et al. | 165/150 |
| 5,020,586 A | 6/1991 | Mansingh | |
| 5,105,877 A * | 4/1992 | Ando | 165/150 |
| 5,131,233 A | 7/1992 | Cray et al. | |
| 5,293,930 A | 3/1994 | Pitasi | |
| 6,166,907 A * | 12/2000 | Chien | 165/80.4 |
| 6,253,839 B1 * | 7/2001 | Reagen et al. | 165/151 |
| 6,351,381 B1 | 2/2002 | Bilski et al. | |
| 6,377,453 B1 | 4/2002 | Belady | |
| 6,496,386 B1 | 12/2002 | Warzecha et al. | |
| 6,529,377 B1 | 3/2003 | Nelson et al. | |
| 6,536,516 B1 | 3/2003 | Davies et al. | |
| 6,628,520 B1 | 9/2003 | Patel et al. | |
| 6,769,196 B1 * | 8/2004 | Park et al. | 165/179 |
| 2002/0117291 A1 * | 8/2002 | Cheon | 165/80.4 |
| 2003/0102112 A1 * | 6/2003 | Smithey et al. | 165/150 |
| 2004/0194935 A1 * | 10/2004 | Cho et al. | 165/150 |
| 2004/0250992 A1 * | 12/2004 | Aoki et al. | 165/80.3 |
| 2005/0061492 A1 * | 3/2005 | Kurihara et al. | 165/150 |

FOREIGN PATENT DOCUMENTS

| | | |
|---|---|---|
| FR | 2 259 341 A1 | 8/1975 |
| GB | 2 144 844 A | 3/1985 |
| GB | 2 180 045 A | 3/1987 |

* cited by examiner

*Primary Examiner*—Teresa J. Walberg (57) ABSTRACT

In a liquid loop cooling device, a heat exchanger includes a tube arranged in a multiple-pass configuration including a plurality of substantially parallel tube segments. The heat exchanger further includes a plurality of fins coupled to the tube segments. The fins for adjacent tube segments are separated by a gap.

25 Claims, 9 Drawing Sheets

MULTIPLE-PASS HEAT EXCHANGER WITH GAPS BETWEEN FINS OF ADJACENT TUBE SEGMENTS

BACKGROUND OF THE INVENTION

Electronic systems and equipment such as computer systems, network interfaces, storage systems, and telecommunications equipment are commonly enclosed within a chassis, cabinet or housing for support, physical security, and efficient usage of space. Electronic equipment contained within the enclosure generates a significant amount of heat. Thermal damage may occur to the electronic equipment unless the heat is removed.

In compact electronic devices, for example compact servers, space internal to a chassis or housing is limited so that severe size constraints are imposed on enclosed heat exchangers. For a multiple-pass liquid-to-air heat exchanger, tubes carrying cooling fluid may be positioned in close proximity. In some locations, tubes carrying heated fluid may pass adjacent to tubes carrying cooled fluid so that heat may conduct from the heated to the cooled fluid along connected metal plates or fins, resulting in sub-optimal cooling of fluid leaving the heat exchanger.

SUMMARY

In accordance with an embodiment of a liquid loop cooling device, a heat exchanger includes a tube arranged in a multiple-pass configuration including a plurality of substantially parallel tube segments. The heat exchanger further includes a plurality of fins coupled to the tube segments. The fins for adjacent tube segments are separated by a gap.

BRIEF DESCRIPTION OF THE DRAWINGS

Embodiments of the invention relating to both structure and method of operation, may best be understood by referring to the following description and accompanying drawings.

DETAILED DESCRIPTION

A liquid loop cooling system uses multiple heat exchangers in the loop to exploit available open space in the chassis of an electronic device.

Figure 1:
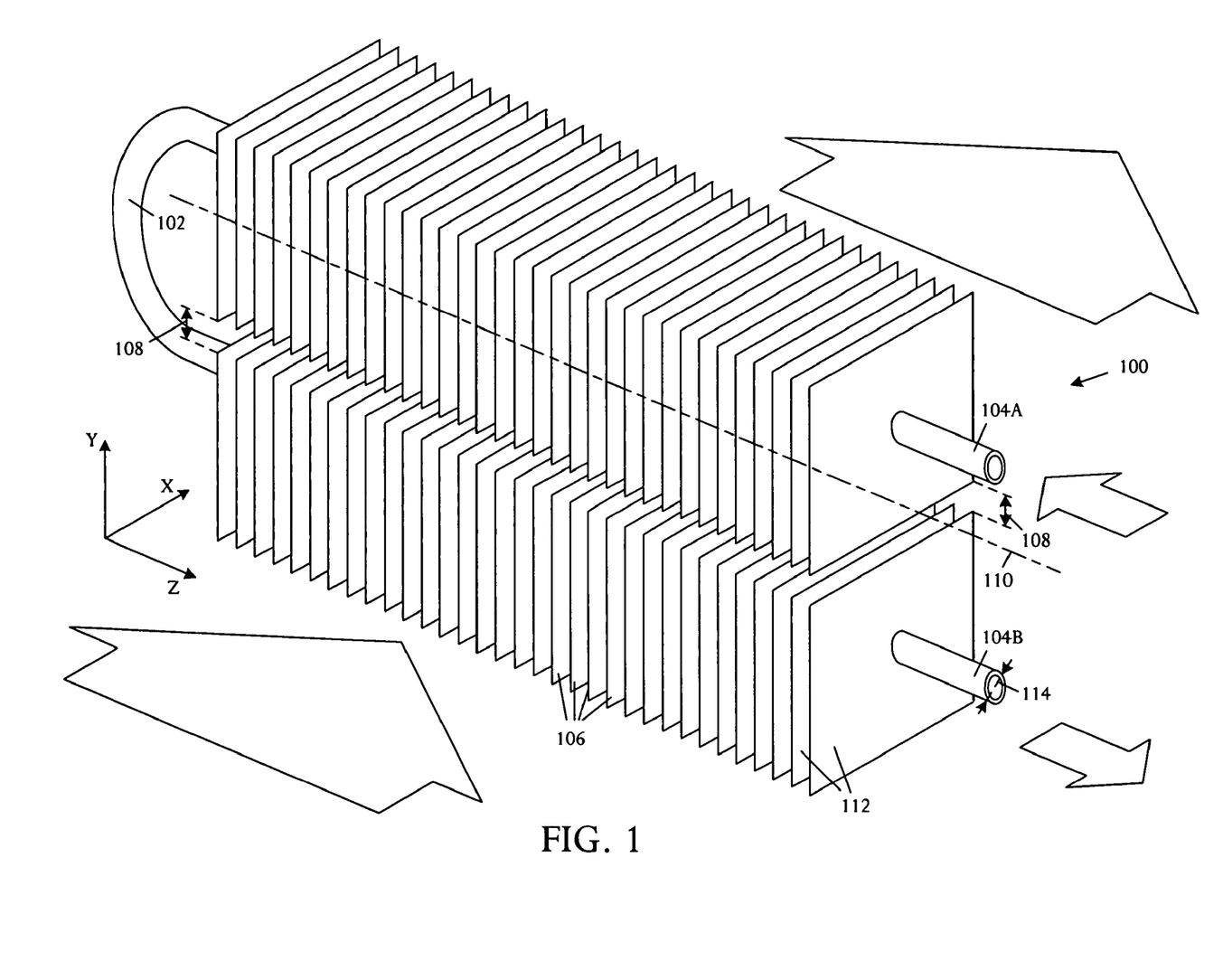
FIG. 1 is a perspective pictorial diagram showing an embodiment of a cooling apparatus for usage in an electronic system.

Referring to FIG. 1, a perspective pictorial diagram illustrates an embodiment of a heat exchanger 100 that includes a tube 102 arranged in a multiple-pass configuration including a plurality of substantially parallel tube segments 104A, 104B. The heat exchanger 100 further includes a plurality of fins 106 coupled to the tube segments 104A, 104B. The fins 106 are capable of channeling cooling air and dissipating heat from the cooling liquid. The fins 106 for adjacent tube segments 104A and 104B are separated by a gap 108.

In the illustrative embodiment, the tube 102 has a longitudinal axis 110 and a circular cross-section 114 and forms the plurality of substantially parallel tube segments 104A, 104B. A stack of closely-spaced plates 112 are arranged substantially perpendicular to the longitudinal axis 110 to form the fins 106 coupled to the tube segments 104A, 104B.

The liquid-to-air heat exchanger 100 includes the fins 106 attached to the tube 102, through which the cooling liquid passes. The liquid enters the tube in a heated condition and cools during passage through the heat exchanger 100, ultimately transferring heat to the air via convection and conduction through the tube walls and the fins.

Figure 2:
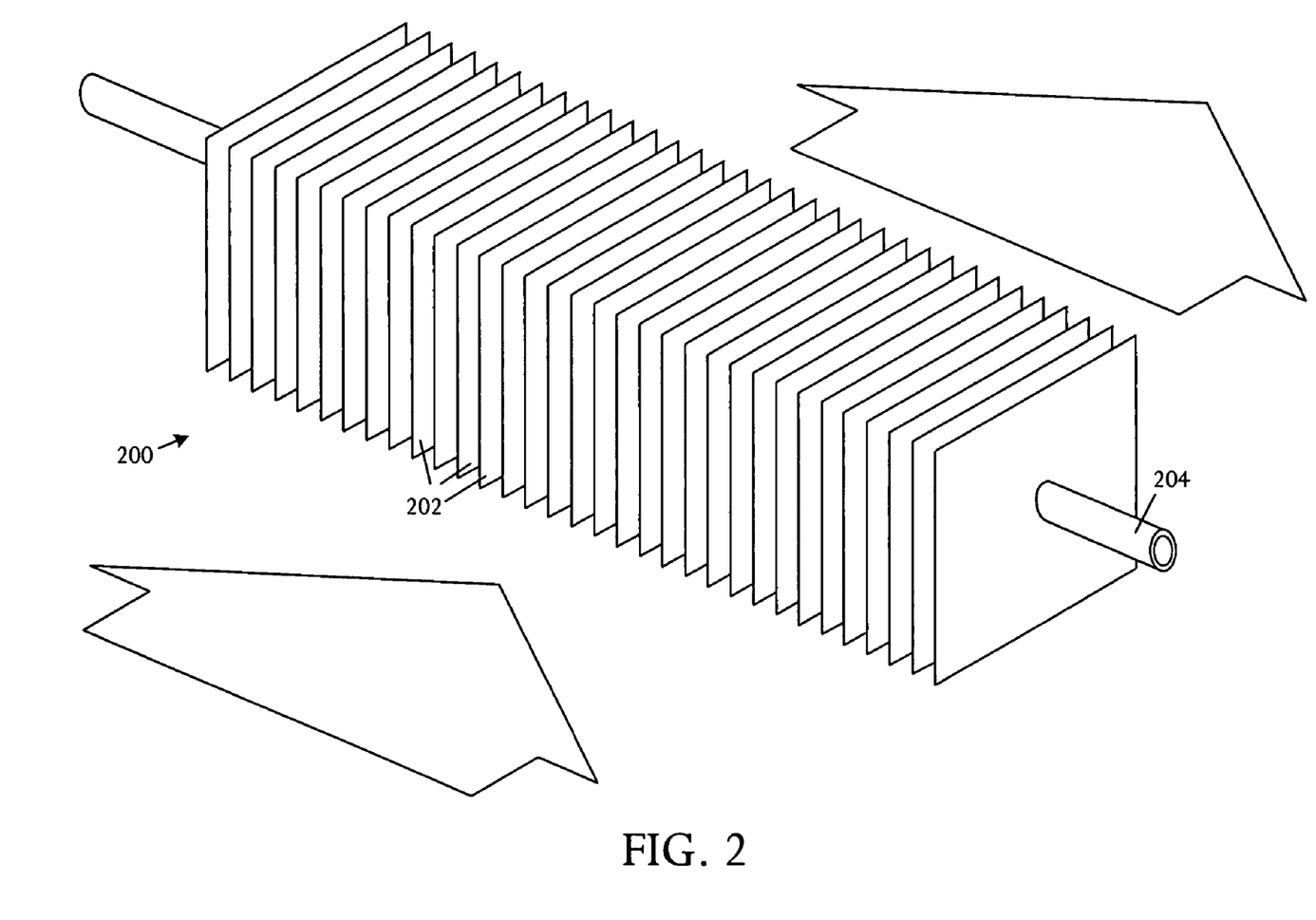
FIG. 2 is a perspective pictorial diagram showing a single-pass heat exchanger.

A simple form of a liquid-to-air heat exchanger 200 is shown in FIG. 2 and includes a stack of closely-space plates 202, called fins, attached to a tube 204 with a circular cross-section. The liquid-to-air heat exchanger 200 is termed a single-pass exchanger because the liquid passes through the heat exchanger 200 one time.

Figure 3:
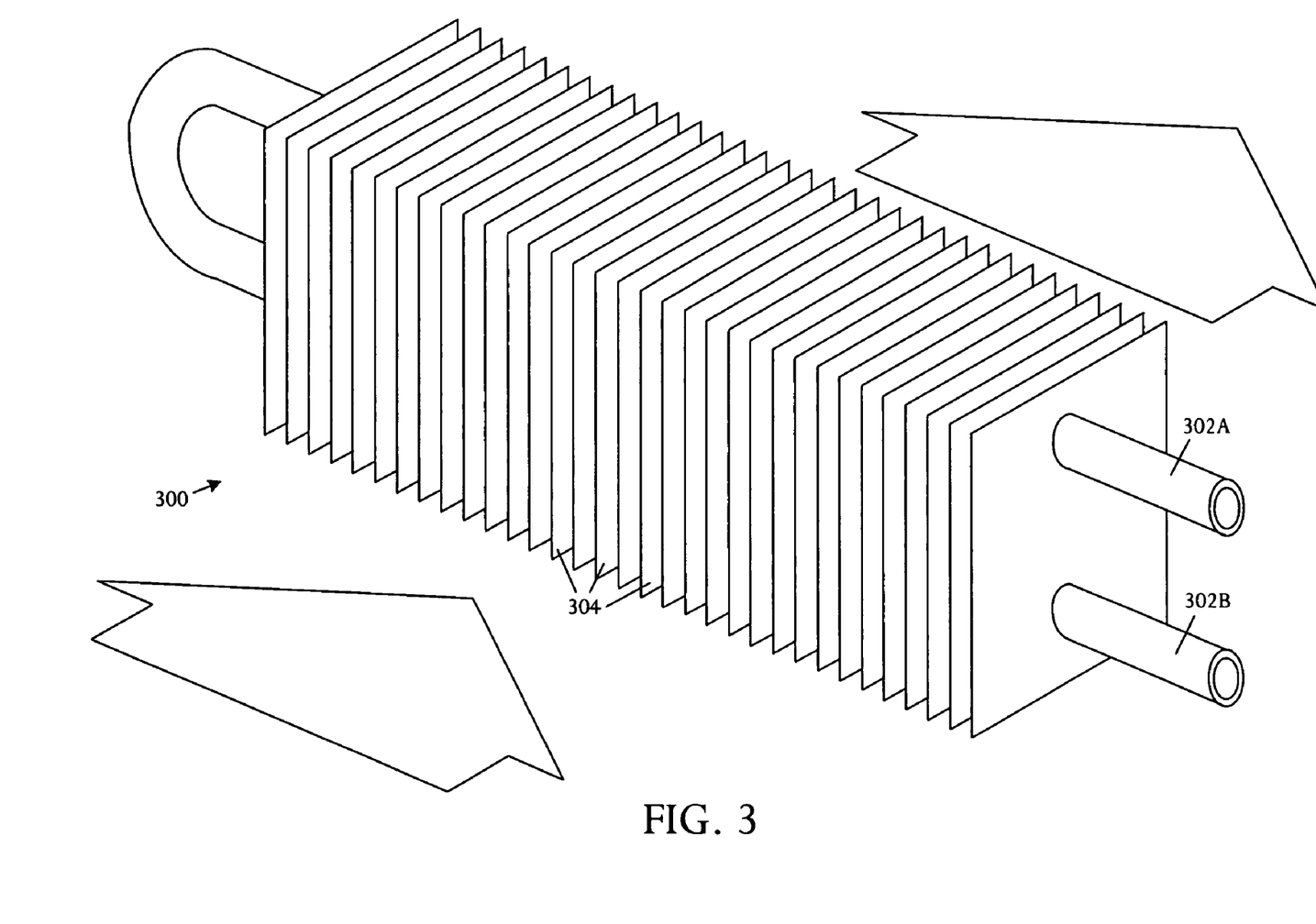
FIG. 3 is a perspective pictorial diagram showing a dual-pass heat exchanger.

More heat can be transferred to the air in a multiple-pass heat exchanger 300, for example as shown in FIG. 3, than in a single-pass exchanger. In a multiple-pass heat exchanger, liquid makes multiple passes through the heat exchanger 300. Each time the liquid passes through the heat exchanger 300; more heat is transferred to the air. In a dual-pass heat exchanger 300, liquid passes through the exchanger twice.

In compact electronics systems and devices, such as computer servers, condensed internal dimensions constrain the size of cooling components such as heat exchangers. In such systems and devices with little internal space, low resistance to airflow is generally desirable. Accordingly, relatively small heat exchangers with maximized fin surface area at an acceptable air flow pressure drop are sought. For a multiple-pass heat exchanger, tubes carrying liquid, such as the tube segments 302A and 302B shown in FIG. 3, are optimally positioned in close proximity. At the end of the heat exchanger 300 where heated liquid enters and cooled liquid exits, heat can be conducted through the fins 304 and may reheat the cooled liquid, causing the temperature of the cooled exiting liquid to be warmer than in the condition that the tube segments 302A and 302B are further separated.

The heat exchanger 100 depicted in FIG. 1 solves the problem of heat transfer between adjacent tube segments by separating the fins 106 connected to the adjacent tube segments 104A and 104B by the gap 108. The gap 108 separate the fins 106 on the tube segment 104B carrying the cooled liquid stream from the fins 106 connected to the tube segment 104A carrying the heated liquid stream, preventing the cooled liquid from being heated by the heated stream. In various embodiments, the heat exchanger 100 may be aligned so that airflow passes through the two tube segments 104A and 104B in sequence with airflow in the Y direction, or so that airflow passes perpendicular to the plane of the two tube segments 104A and 104B with airflow in the X direction.

Figure 4A:
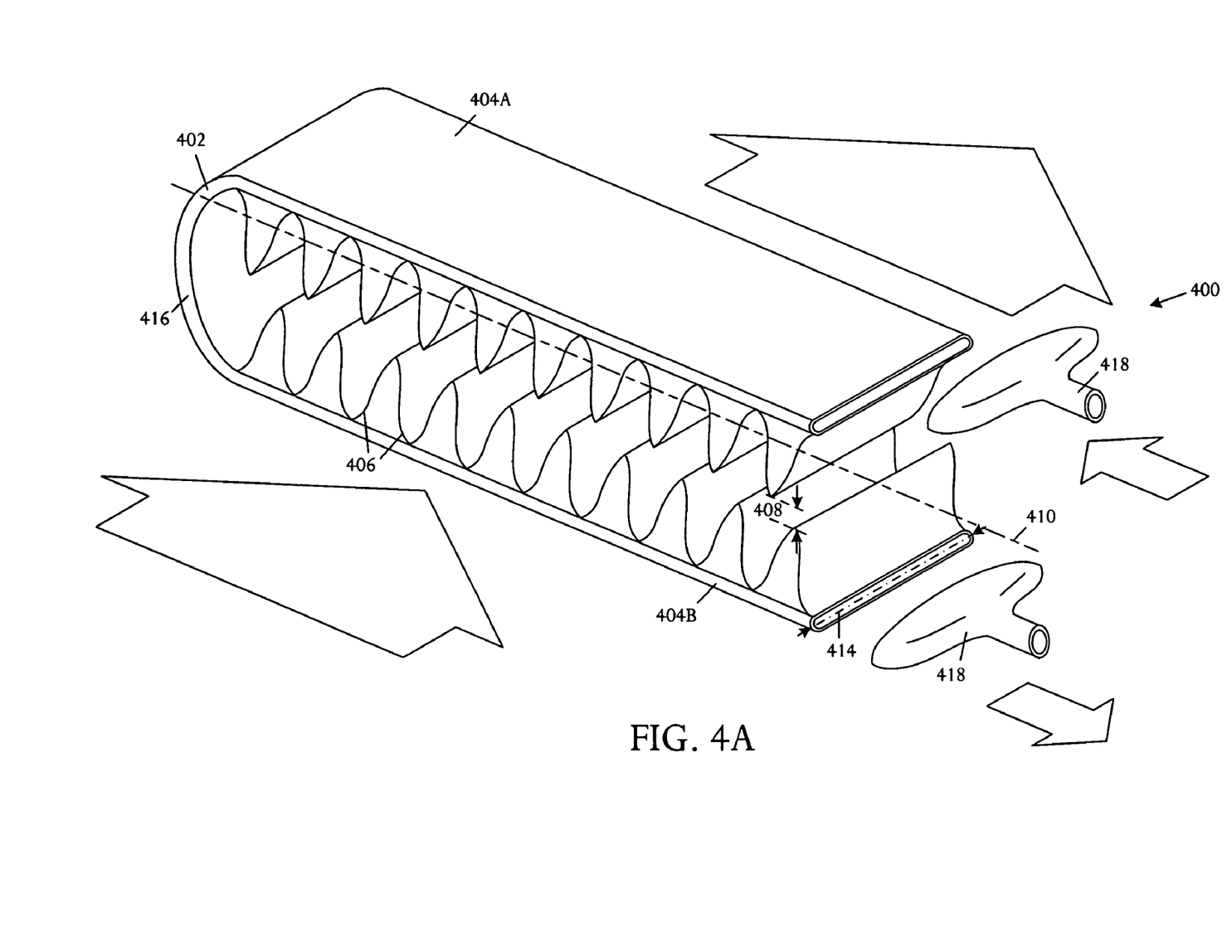
FIGS. 4A and 4B are perspective pictorial diagrams depicting embodiments of multiple-pass heat exchangers.

Referring to FIG. 4A, a perspective pictorial diagram depicts another embodiment of a multiple-pass heat exchanger 400 that includes a tube 402 having a longitudinal axis 410 and a flattened cross-section 414 forming a plurality of substantially parallel tube segments 404A and 404B. The heat exchanger 400 has a plurality of folded fins 406 coupled to the flattened cross-section tube segments 404A, 404B. The folded fins 404A and 404B of adjacent flattened cross-section tube segments are separated by a gap 408. Also in the illustrative embodiment, a flattened cross-section tube end joint 416 folds approximately 180° and couples the two adjacent flattened cross-section tube segments 404A, 404B.

The illustrative dual-pass liquid-to-air heat exchanger 400 has the form of a flattened tube 402 for carrying a cooling liquid with folded fins 406 soldered or braised to the tube 402. In the illustrative embodiment, two separate sets of folded fins are used, one attached to a first tube segment and a second attached to a second tube segment. The flattened-tube heat exchanger 400 enables a large variety of arrangements, sizes, and configurations, simply by selecting the sizes and topology of folded fins 406 and tube 402.

The technique for constructing the flattened cross-section tube segments and fins is similar to that for manufacturing automobile radiators in which the folded fin spans the entire space between the tubes, effectively connecting and thermally coupling the tubes. In the illustrative heat exchanger 400, two separate sets of folded fins are used, one attached to one tube 404A and a second attached to the second tube 404B, creating the gap 408 between the two fin structures. Usage of materials and processes common to the well-developed automotive field may facilitate efficient and economic production and development.

In some embodiments, the heat exchanger 400 has at least one end transition cap 418 configured to couple a flattened cross-section tube segment 404A, 404B to a circular cross-section attachment.

The flattened structure of the tube segments 404A, 404B may have a larger cross-sectional area of the internal lumen, enabling a lower pressure drop as the liquid passes through a loop. For a lengthy loop, the reduction in pressure drop can facilitate liquid flow and promote cooling.

Similarly, the flattened tubes generally have a smaller airflow blockage than circular cross-section tubes, assisting fluid flow in a system with constrained space.

The flattened tubes form a large surface area for liquid heat exchange and fin attachment, minimizing or reducing thermal resistance. The flattened tubes can be thermally connected to surfaces of the chassis or housing in an electronic system using a compliant thermal interface pad.

Figure 4B:
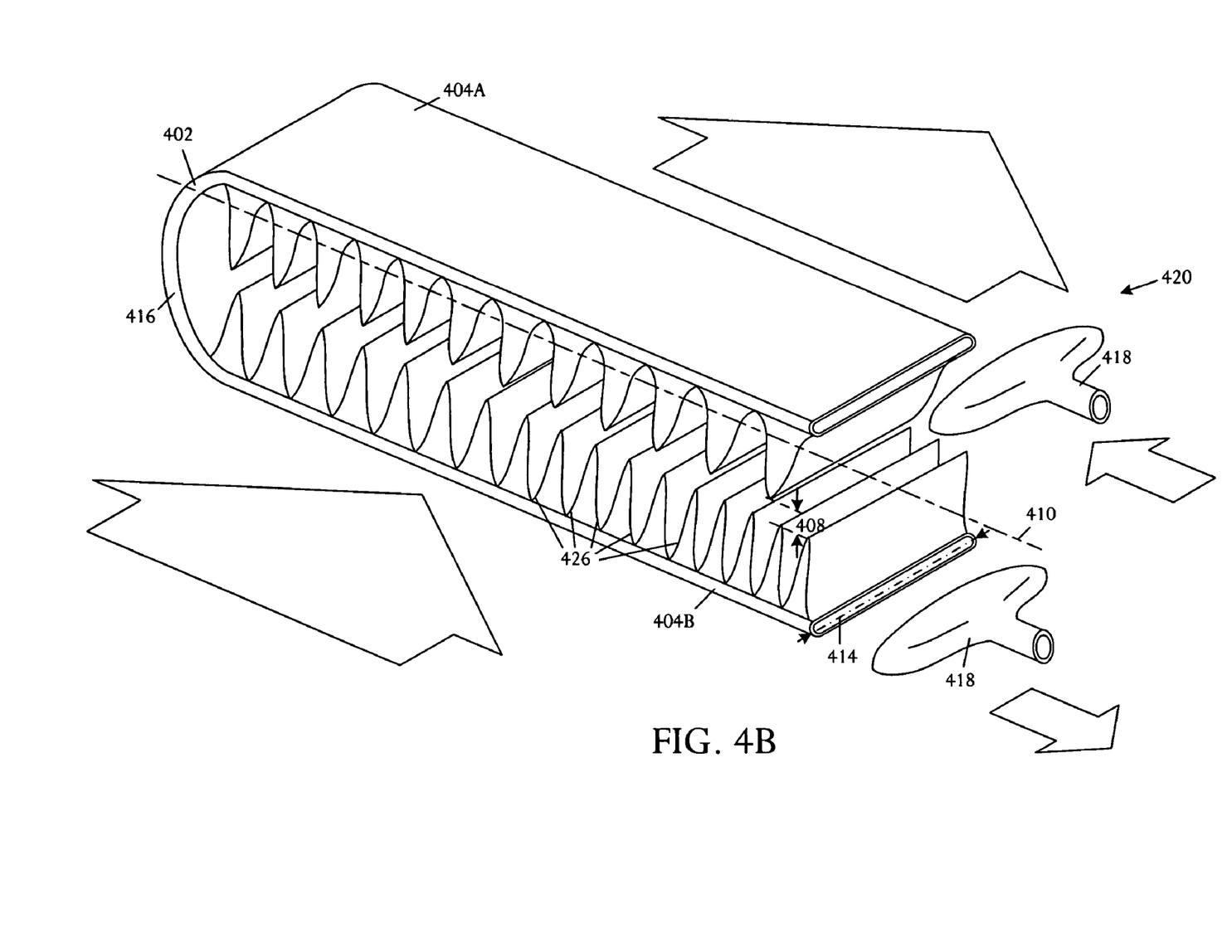

Referring to FIG. 4B, a perspective pictorial diagram depicts a alternative embodiment of a heat exchanger 420, also having a flattened cross-section tube 402 although the multiple folded fins 426 have a variable pitch at different positions along the tube 402.

Figure 5:
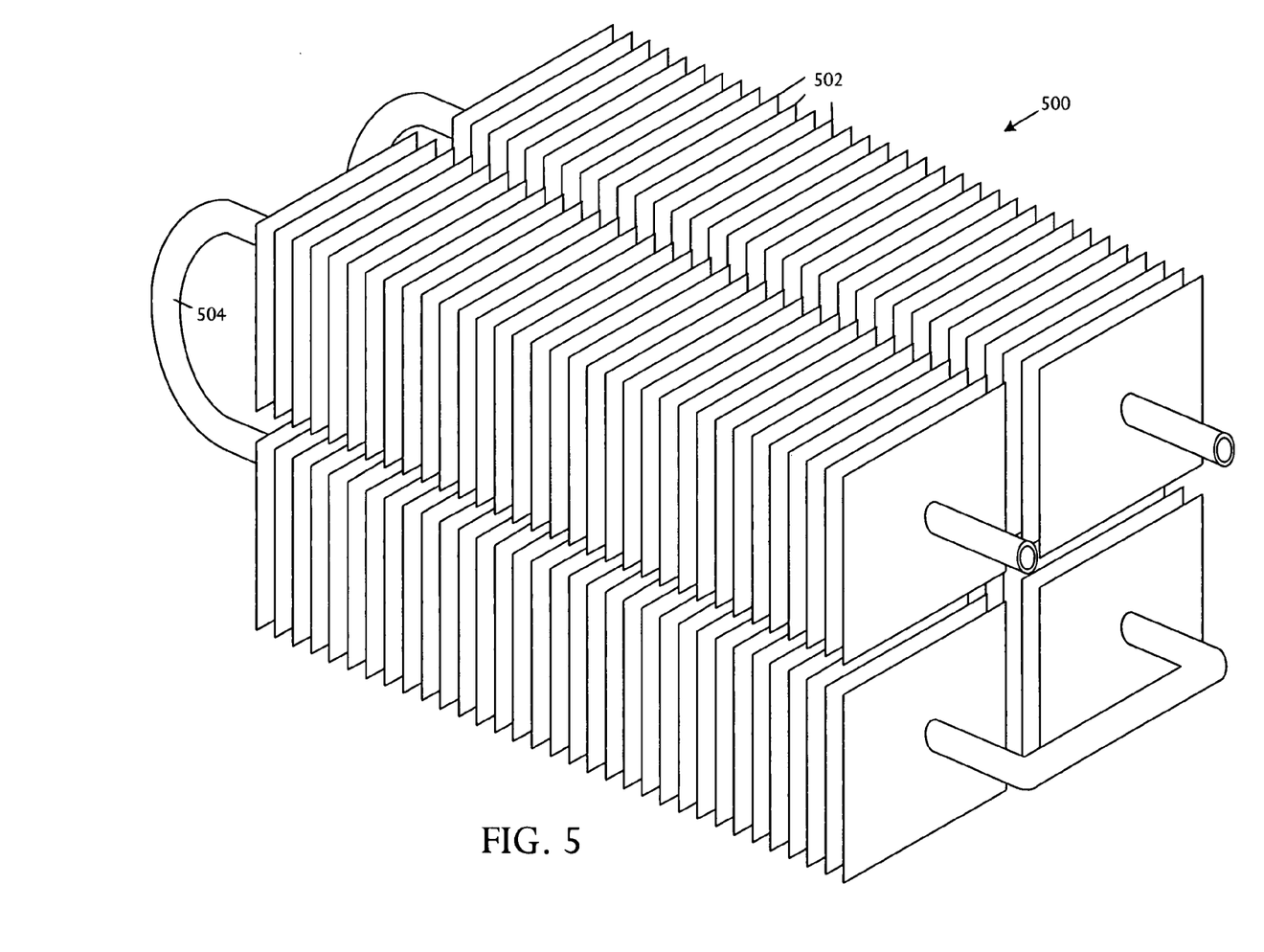
FIGS. 5 and 6 are schematic pictorial diagrams illustrate examples of various embodiments of multiple-pass heat exchangers that can be used in the illustrative cooling and electronic devices and systems.

FIG. 5 shows an embodiment of a multiple-pass liquid-to-air heat exchanger 500, more specifically a quad-pass exchanger although any number of tubing segments 504 may be used, depending on available spacing and form factor considerations. The tube 504 may pass through a fin bank 502 multiple times and in various orientations to attain improved or optimized cooling performance. The multiple-pass heat exchanger 500 may be used in systems with relative large spaces between components and devices to even further supply a cooling capability. In the illustrative embodiment, fins 502 coupled to the various tubing segments 504 are separated by a gap to reduce or eliminate reheating of the cooling liquid by conduction of heat along the fins 502.

Figure 6:
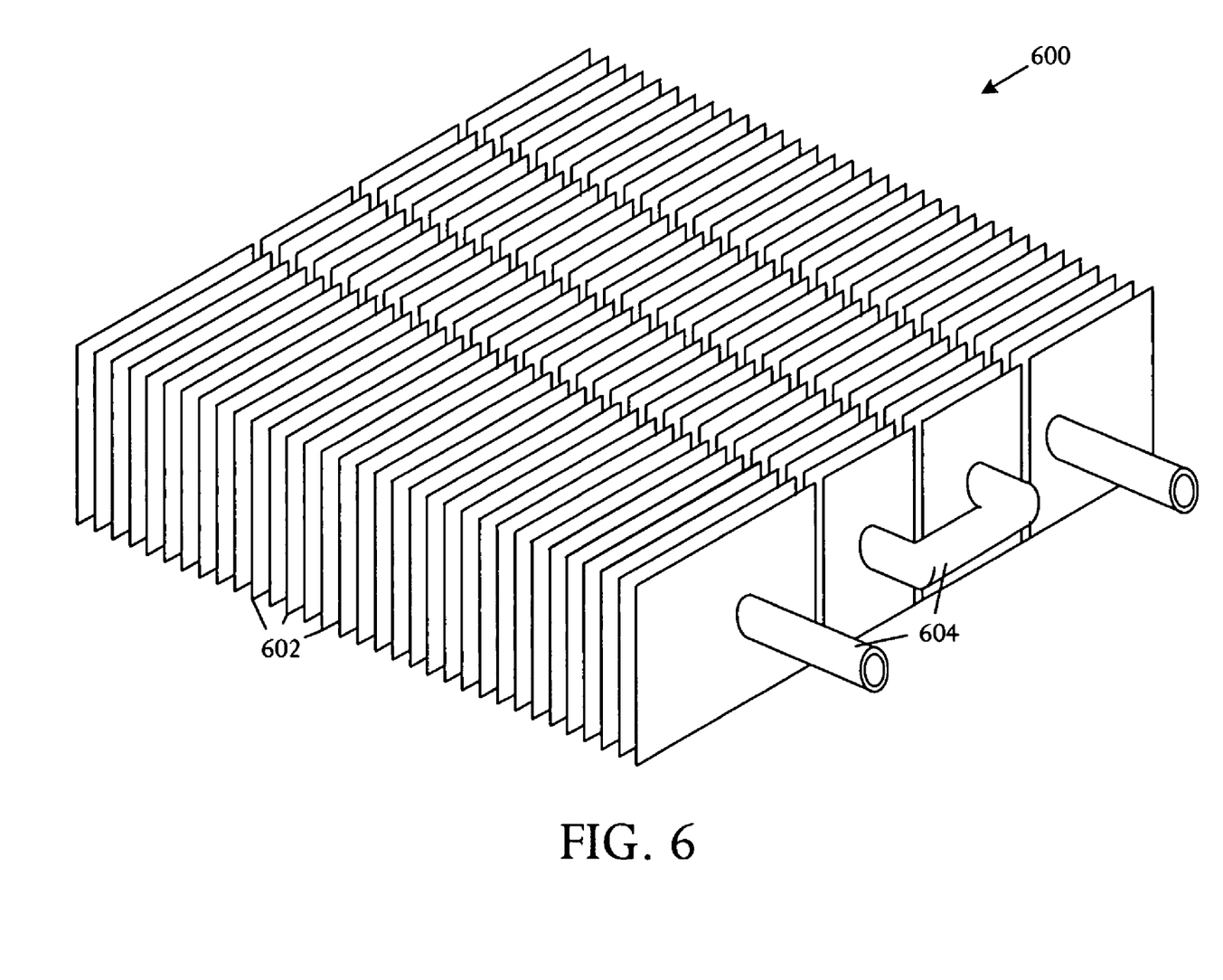

FIG. 6 illustrates and example of a relatively short and flat multiple-pass heat exchanger 600 with a plurality of tubing segments 604 passing through multiple stacks of fins 602 with the individual stacks separated by a gap to avoid heat conduction between fins connected to adjacent tubing segments. The heat exchanger 600 may be used in a relatively wide and long, but low height space in a system. In other examples, the heat exchanger 600 may be positioned overlying a group of low-lying components, such as multiple components such as processors and memory, on a printed circuit card.

Figure 7:
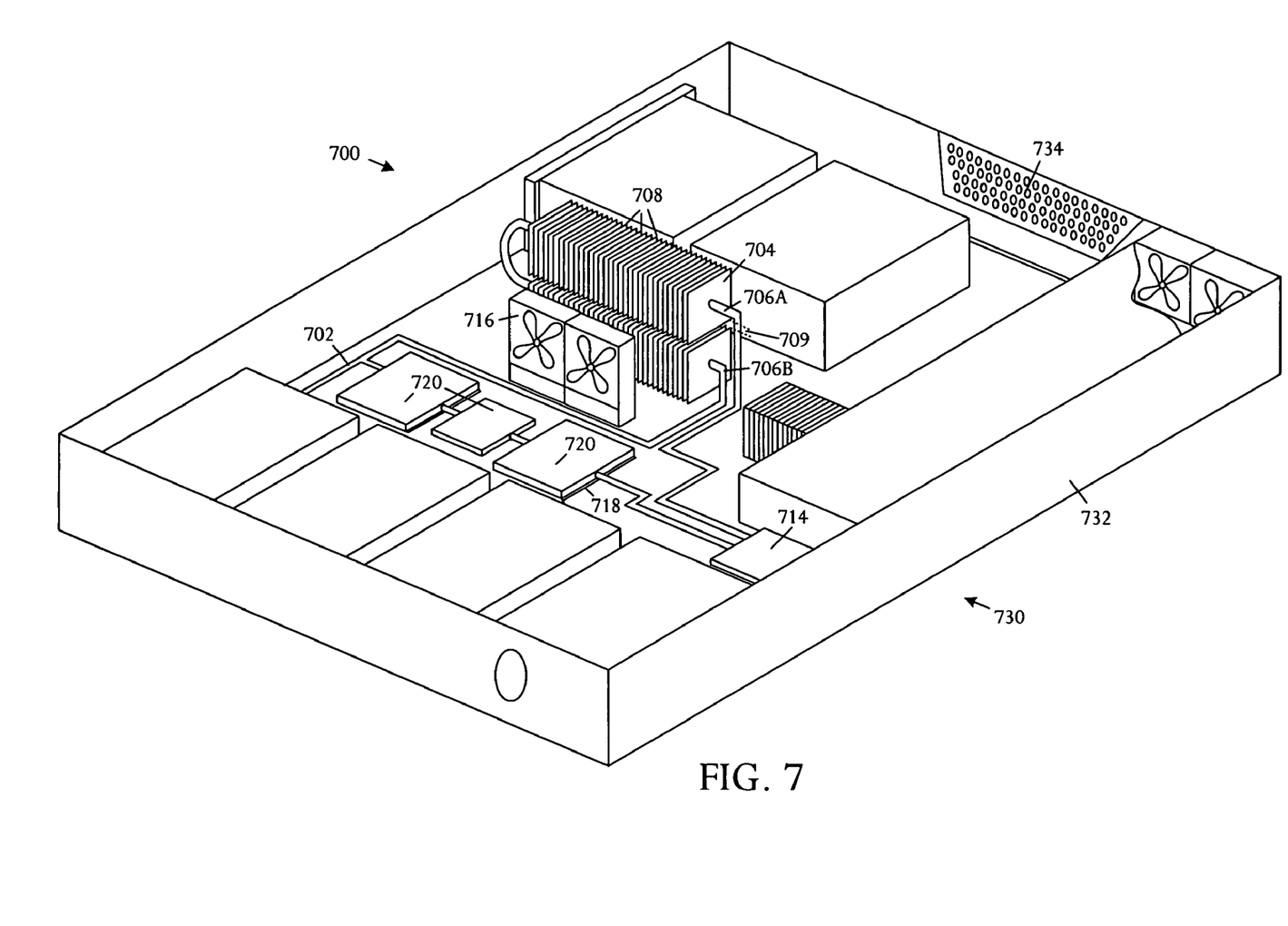
FIG. 7 is a perspective pictorial diagram illustrating embodiments of an electronic system, such as a computer server, and a liquid loop cooling system.

Referring to FIG. 7, a perspective pictorial diagram illustrates an embodiment of an electronic system 700, for example a computer server, which includes a liquid-to-air heat exchanger 704 with tube segments 706A, 706B separated by a gap. The electronic system 700 includes a chassis 732 with airflow inlet and outlet vents 734, and fans 716 capable of circulating air from the inlet vents to the outlet vents. The electronic system 700 typically has a plurality of components 720 mounted within the chassis 732 including at least one processor and at least one storage device.

The liquid to air heat exchanger 704 includes a tubing arranged in a multiple-pass configuration including multiple tube segments 706A, 706B. In the illustrative embodiment, the tube segments 706A, 706B are arranged in a substantially parallel configuration with a plurality of fins 708 coupled to the tube segments. The fins 708 are configured as a stack of closely-spaced plates arranged substantially perpendicular to the longitudinal axis coupled to the tube segments 706A, 706B. The plates extend toward the adjacent tube segment a distance that leaves the gap 709 between adjacent segment plates sufficient to substantially reduce or eliminate heat transfer between the adjacent tube segments.

Also referring to FIG. 7, an embodiment of a liquid loop cooling system 730 that can be used in the electronic system 700 includes a tubing 702 having an interior lumen capable of containing a circulating cooling fluid, a pump 714, and the heat exchanger 704. The pump 714 is generally coupled to the tubing 702 and capable of pumping the cooling fluid through the tubing 702. The cooling system 700 also includes the cooling fluid, in some examples and ethylene glycol-based fluid although other suitable fluids may otherwise be used. The cooling fluid is contained within the tubing 702 and the tube segments 706 of the plurality of heat exchangers 704.

One or more fans 716 configured to drive air through the heat exchangers 704 can be included in the cooling system 700. In addition, one or more cold plates 718 may be coupled to the tubing 702. The cold plates 718 are generally attached to processors and other high-power components 720 to enable cooling of localized heat sources.

In the liquid loop cooling system 730, the pump 714 drives cooling fluid through one or more cold plates 718, the tubing 702, and the heat exchanger 704. Heat is removed from the loop by forced-air convection at the heat exchanger 704. The heat exchanger 704 has improved thermal performance on the basis of the multiple-pass heat exchange capability with separation between fins 708 connected to the different tube segments.

Figure 8:
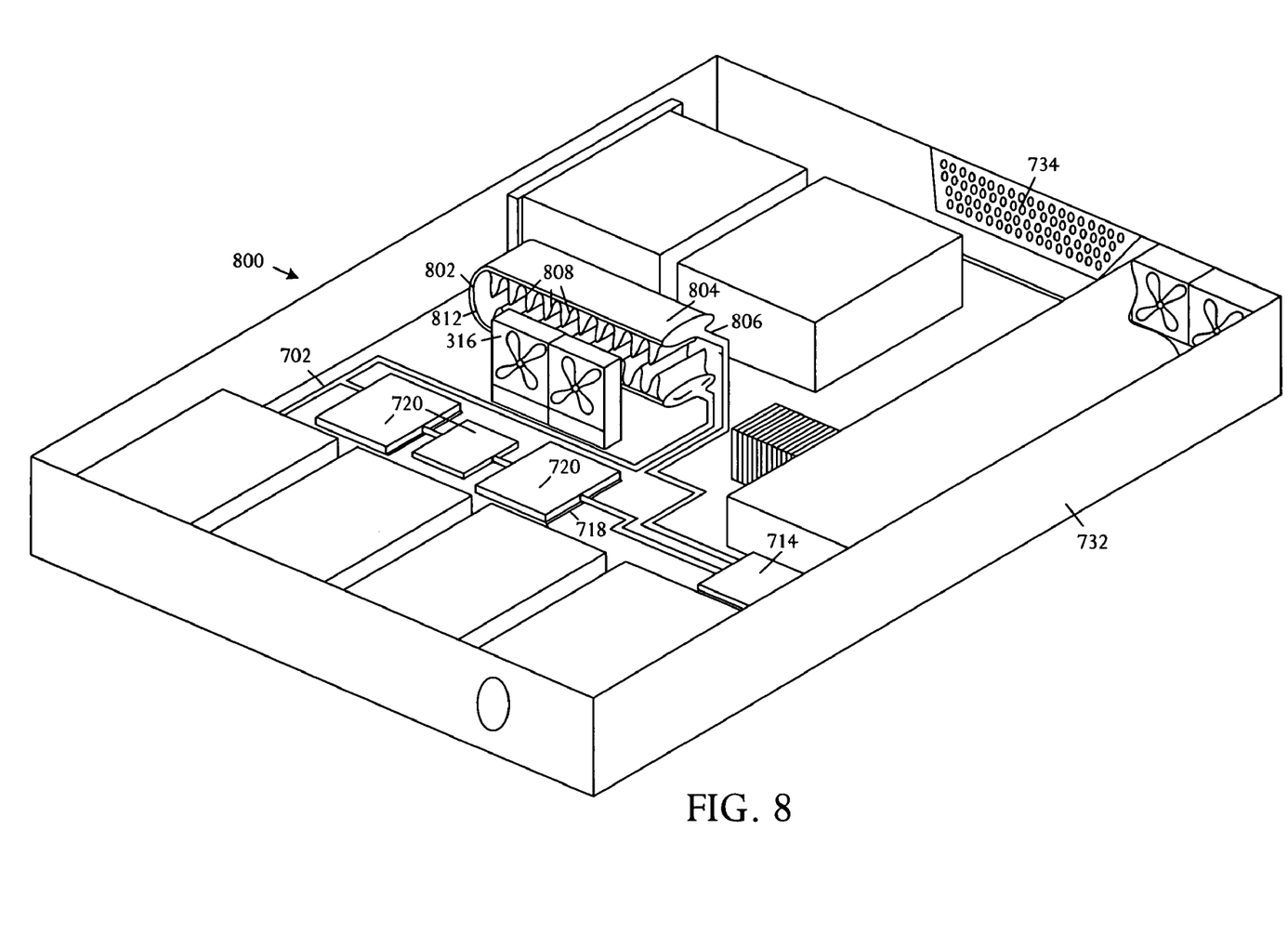
FIG. 8 is a perspective pictorial diagram showing embodiments of an electronic system, such as a computer server, and a liquid loop cooling system, both using a flattened-tube heat exchanger.

Referring to FIG. 8, a perspective pictorial diagram illustrates an embodiment of an electronic system 800 that includes a heat exchanger 804 in the form of a tube 802 having a longitudinal axis and a flattened cross-section forming a plurality of compactly spaced and substantially parallel tube segments 806A, 806B.

Also referring to FIG. 8, an embodiment of a liquid loop cooling system 830 can be used in the electronic system 800 that includes a tubing 702 having an interior lumen capable of containing a circulating cooling fluid, a pump 714, and the heat exchanger 804 with flattened cross-sectional tube segments 806A, 806B.

The heat exchanger 804 also includes a plurality of folded fins 808 attached to the flattened cross-section tube segments 806A, 806B. The folded fins 808 of adjacent flattened cross-section tube segments 806A and 806B are separated by a gap 809. The folded fins 808 extend toward the adjacent tube segment a selected distance that leaves the gap 809 between adjacent segment fins that is sufficient to substantially eliminate heat transfer between the adjacent tube segments 806A, 806B.

In some embodiments, the multiple folded fins 808 have a variable pitch at different positions along the tube 802 to optimize cooling performance along the longitudinal axis of the tube and in airflow paths within the chassis 832.

In some embodiments, the heat exchanger 804 includes a flattened cross-section tube end joint 812 coupling two adjacent flattened cross-section tube segments 806A, 806B and folds approximately 180' in a compact curve that enables the heat exchanger 804 to fit within a thin chassis.

The heat exchanger 804 may also include end transition caps 814 configured to couple a flattened cross-section tube segments 806A, 806B to a circular cross-section attachment in a closed-loop cooling system 830.

While the present disclosure describes various embodiments, these embodiments are to be understood as illustrative and do not limit the claim scope. Many variations, modifications, additions and improvements of the described embodiments are possible. For example, those having ordinary skill in the art will readily implement the steps necessary to provide the structures and methods disclosed herein, and will understand that the process parameters, materials, and dimensions are given by way of example only. The parameters, materials, and dimensions can be varied to achieve the desired structure as well as modifications, which are within the scope of the claims. Variations and modifications of the embodiments disclosed herein may also be made while remaining within the scope of the following claims. For example, although particular geometries of the heat exchanger are shown, other arrangements are possible including additional multiple-pass arrangements in which additional tube segments are added. Also, particular electronic system embodiments are illustrated, for example a computer server. In other embodiments, the external heat exchanger can be employed in other types of electronic systems such as communication systems, storage systems, entertainment systems, and the like.

What is claimed is:

1. An apparatus comprising:
   a heat exchanger comprising:
      a cylindrical tube arranged in a multiple-pass configuration including a plurality of substantially parallel tube segments, the cylindrical tube extending and coupled to a cooling plate adapted for cooling an electronic component; and
      a plurality of closely-spaced planar plate fins arranged in mutually parallel planes and coupled to the tube segments, the fins for adjacent tube segments being separated by a gap.

2. The apparatus according to claim 1 further comprising:
   a tube having a longitudinal axis and a circular cross-section forming the plurality of substantially parallel tube segments; and
   a stack of closely-spaced plates medially intersected by a circular aperture fined to receive the tube and arranged substantially perpendicular to the longitudinal axis forming the fins coupled to the tube segments.

3. The apparatus according to claim 1 further comprising:
   ethylene glycol-based fluid contained within the tube.

4. The apparatus according to claim 1 further comprising:
   at least one fan arranged to generate an airflow pathway in an airflow direction parallel to the mutually parallel planes of the planar plate fin plurality, at least two of the adjacent gap-separated tube segments arranged sequentially along the airflow pathway.

5. The apparatus according to claim 1 further comprising:
   at least one fan arranged to generate an airflow pathway in an airflow direction parallel to the mutually parallel planes of the planar plate fin plurality, at least two of the adjacent gap-separated tube segments arranged at an angle perpendicular to the airflow pathway.

6. The apparatus according to claim 1 further comprising:
   at least one fan arranged to generate an airflow pathway in an airflow direction parallel to the mutually parallel planes of the planar plate fin plurality, at least two of the adjacent gap-separated tube segments arranged sequentially along the airflow pathway and at least two of the adjacent gap-separated tube segments arranged at an angle perpendicular to the airflow pathway.

7. An electronic system comprising:
   a chassis including airflow inlet mid outlet vents, and fans adapted to circulate air from the inlet vents to the outlet vents along an airflow pathway;
   a plurality of components mounted within the chassis; and
   a liquid to air heat exchanger comprising:
      a cylindrical tube arranged in a multiple-pass configuration including a plurality of substantially parallel tube segments, the cylindrical tube extending and coupled to a cooling plate adapted for cooling an electronic component; and
      a plurality of closely-spaced planar plate fins arranged in mutually parallel planes and coupled to the tube segments, the fins for adjacent tube segments being separated by a gap.

8. The electronic system according to claim 7 wherein the heat exchanger further comprises:
   a tube having a longitudinal axis and a circular cross-section forming a plurality of compactly spaced and substantially parallel tube segments; and
   a stack of closely-spaced plates medially intersected by a circular aperture fitted to receive the tube and arranged substantially perpendicular to the longitudinal axis forming the fins coupled to the tube segments, the plates extending toward the adjacent tube segment a distance that leaves a gap between adjacent segment plates sufficient to substantially eliminate heat transfer between the adjacent tube segments.

9. The electronic system according to claim 7 wherein the heat exchanger further comprises:
   ethylene glycol-based fluid contained within the tube.

10. The electronic system according to claim 8 wherein the heat exchanger further comprises:
    at least one fan arranged to generate the airflow pathway in an airflow direction parallel to the mutually parallel planes of the planar plate fin plurality, at least two of the adjacent gap-separated tube segments arranged sequentially along the airflow pathway.

11. The electronic system according to claim 7 wherein the heat exchanger further comprises:
    at least one fan arranged to generate the airflow pathway in an airflow direction parallel to the mutually parallel planes of the planar plate fin plurality, at least two of the adjacent gap-separated tube segments arranged at an angle perpendicular to the airflow pathway.

12. The electronic system according to claim 7 wherein the heat exchanger further comprises:
   at least one fan arranged to generate the airflow pathway in an airflow direction parallel to the mutually parallel planes of the planar plate fin plurality, at least two of the adjacent gap-separated tube segments arranged sequentially along the airflow pathway and at least two of the adjacent gap-separated tube segments arranged at an angle perpendicular to the airflow pathway.

13. A liquid loop cooling system comprising:
   a tubing including an interior lumen within which a cooling fluid can circulate;
   a pump coupled to the tubing and capable of pumping the cooling fluid through the tubing; and
   a heat exchanger coupled to the tubing, the heat exchanger comprising:
      a cylindrical tube arranged in a multiple-pass configuration including a plurality of substantially parallel tube segments, the cylindrical tube extending and coupled to a cooling plate adapted for cooling an electronic component; and
      a plurality of closely-spaced planar plate fins arranged in mutually parallel planes and coupled to the tube segments, the fins for adjacent tube segments being separated by a gap.

14. The cooling system according to claim 13 further comprising:
   an ethylene glycol-based cooling fluid contained within the tubing and tube.

15. The cooling system according to claim 13 further comprising:
   a fan configured to drive air through the heat exchanger.

16. The cooling system according to claim 13 further comprising:
   a cold plate coupled to the heat exchanger.

17. The cooling system according to claim 13 wherein the heat exchanger further comprises:
   a tube having a longitudinal axis and a circular cross-section forming a plurality of compactly spaced and substantially parallel tube segments; and
   a stack of closely-spaced plates arranged substantially perpendicular to the longitudinal axis forming the fins coupled to the tube segments, the plates extending toward the adjacent tube segment a distance tat leaves a gap between adjacent segment plates sufficient to substantially eliminate heat transfer between the adjacent tube segments.

18. The cooling system according to claim 13 wherein the heat exchanger further comprises:
   at least one fan arranged to generate an airflow pathway in an airflow direction parallel to the mutually parallel planes of the planar plate fin plurality, at least two of the adjacent gap-separated tube segments arranged sequentially along the airflow pathway.

19. The cooling system according to claim 13 wherein the heat exchanger further comprises:
   at least one fan arranged to generate an airflow pathway in an airflow direction parallel to the mutually parallel planes of the planar plate fin plurality, at least two of the adjacent gap-separated tube segments arranged at an angle perpendicular to the airflow pathway.

20. The cooling system according to claim 13 wherein the heat exchanger further comprises:
   at least one fan arranged to generate an airflow pathway in an airflow direction parallel to the mutually parallel planes of the planar plate fin plurality, at least two of the adjacent gap-separated tube segments arranged sequentially along the air flaw pathway and at least two of the adjacent gap-separated tube segments arranged at an angle perpendicular to the airflow pathway.

21. A heat exchanger comprising:
   a flattened tube extending along a longitudinal axis and folded approximately 180° to couple adjacent flattened cross-sectional tube segments; and
   a plurality of folded fins coupled exclusively interior to adjacent flattened cross-section tube segments, the folded fins of adjacent flattened cross-section tube segments being separated by the gap.

22. The heat exchanger according to claim 21 further comprising:
   the plurality of folded tins having a pitch varying with longitudinal axis along the interior of the adjacent flattened cross-section tube segments.

23. The heat exchanger according to claim 21 further comprising:
   the plurality of folded fins arranged in mutually parallel surfaces extending generally perpendicular to the longitudinal axis; and
   at least one fan arranged to generate the airflow pathway in an airflow direction approximately parallel to the mutually parallel surfaces of the folded fin plurality.

24. The beat exchanger according to claim 21 further comprising:
   an integrated circuit;
   a cold plate arranged to cool the integrated circuit;
   a tubing coupled to the cold plate;
   the flattened tube extending to first and second ends; and
   first and second transition caps configured to respectively couple the flattened tube first and second ends to the tubing.

25. The heat exchanger according to claim 21 further comprising:
   the flattened tube having a single lumen extending essentially the flattened tube width whereby pressure drop of a liquid passing through the flattened tube is reduced.

* * * * *

UNITED STATES PATENT AND TRADEMARK OFFICE
CERTIFICATE OF CORRECTION

PATENT NO. : 6,997,247 B2  Page 1 of 1
APPLICATION NO. : 10/835955
DATED : February 14, 2006
INVENTOR(S) : Christopher G. Malone et al.

It is certified that error appears in the above-identified patent and that said Letters Patent is hereby corrected as shown below:

IN THE SPECIFICATION

Column 5, line 21, delete "180'" and insert therefor --180°--

IN THE CLAIMS

Claim 2, Column 5, line 67, delete "fined" and insert therefor --fitted--

Claim 7, Column 6, line 26, delete "mid" and insert therefor --and--

Claim 17, Column 7, line 46, delete "tat" and insert therefor --that--

Claim 20, Column 8, line 14, delete "air flaw" and insert therefor --airflow--

Signed and Sealed this

Sixteenth Day of October, 2007

JON W. DUDAS
*Director of the United States Patent and Trademark Office*